(12) United States Patent
Nishikawa et al.

(10) Patent No.: US 9,758,308 B1
(45) Date of Patent: Sep. 12, 2017

(54) ARTICLE TRANSPORT FACILITY

(71) Applicant: Daifuku Co., Ltd., Osaka-shi (JP)

(72) Inventors: Tadashi Nishikawa, Hinocho (JP);
Takeshi Shin, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 0 days.

(21) Appl. No.: 15/483,137

(22) Filed: Apr. 10, 2017

(30) Foreign Application Priority Data

Apr. 11, 2016 (JP) .................................. 2016-078786

(51) Int. Cl.
*G06F 7/00* (2006.01)
*B65G 35/06* (2006.01)

(52) U.S. Cl.
CPC ...... *B65G 35/06* (2013.01); *B65G 2201/0297* (2013.01)

(58) Field of Classification Search
CPC .................................................... B65G 35/06
USPC ........................................................ 700/230
See application file for complete search history.

(56) References Cited

U.S. PATENT DOCUMENTS

| | | | | |
|---|---|---|---|---|
| 2007/0294029 | A1* | 12/2007 | D'Andrea | ............ G01C 21/005 701/410 |
| 2008/0051985 | A1* | 2/2008 | D'Andrea | ........ G05B 19/41895 701/410 |
| 2014/0358338 | A1* | 12/2014 | Harasaki | ........... H01L 21/67715 701/19 |
| 2016/0174453 | A1* | 6/2016 | Matsuzaki | ............. A01B 69/00 701/2 |

FOREIGN PATENT DOCUMENTS

JP          2000250628 A     9/2000

* cited by examiner

*Primary Examiner* — Kyle Logan
(74) *Attorney, Agent, or Firm* — The Webb Law Firm

(57) ABSTRACT

The article transport vehicles are equipped with wireless tags that transmit tag information, and an article transport facility includes: a transport control apparatus that controls the entrance of the vehicles into the control area such that the number of vehicles that are present in one control area is no greater than a control number; a plurality of access points; and a position detection apparatus that detects the respective positions of the vehicles with an accuracy with which a plurality of positions in the control area are distinguishable, based on the same tag information that has been received by the access points. The transport control apparatus permits a number of vehicles, the number being greater than the control number, to enter the control area if a predetermined permission condition is satisfied, based on the positional information that indicates the position of each vehicle.

10 Claims, 9 Drawing Sheets

ARTICLE TRANSPORT FACILITY

CROSS-REFERENCE TO RELATED APPLICATION

This application claims priority to Japanese Patent Application No. 2016-078786 filed Apr. 11, 2016, the disclosure of which is hereby incorporated in its entirety by reference.

BACKGROUND OF THE INVENTION

Field of the Invention

The present invention relates to an article transport facility that includes: a plurality of article transport vehicles that travel along a travel path in only one direction to transport articles, and a transport control apparatus that controls each article transport vehicle.

Description of the Related Art

In factories and warehouses, automatic article transport using automatic guided vehicles (article transport vehicles) has been put into practice. In many cases, automatic guided vehicles autonomously travel along preset travel paths according to instructions and programs that are provided from a host control apparatus via communication. However, travel paths often include, for example, branching paths, converging paths, and intersecting paths, and therefore travel control is desired to be performed to prevent article transport vehicles from colliding with each other at, for example, a branching point, a convergence point, or an intersection point. JP 2000-250628A (Patent Document 1) discloses technology for setting control zones (control areas) that include such a branching point, a convergence point, an intersection point, or the like, and restricting article transport vehicles from entering the control zones based on predetermined conditions. Typically, the entrance of two or more article transport vehicles into such a control zone is restricted. (e.g. Patent Document 1: [0004], [0010], etc.)

For example, as shown in FIGS. 1 and 11 of Patent Document 1, in the case where a detour path (R3) is provided between two straight paths (R1 and R2) that are parallel to each other, a control zone (D1) is set to an area that includes: a branching point (A1) between one straight path (R1) and the detour path (R3); and a convergence point (B1) between the other straight path (R2) and the detour path (R3) in one aspect as shown in FIG. 11. In this case, the number of article transport vehicles that can enter the control zone (D1) is limited to one. Entrance into the control zone (D1) is restricted even in a simple case where two article transport vehicles respectively travel straight along the two straight paths (R1 and R2). Therefore, although there is no risk of a collision, either one of the article transport vehicles needs to wait, and thus the transport efficiency of the facility decreases as a whole. In view of such a problem, Patent Document 1 proposes that, as shown in FIG. 1 of Patent Document 1, a plurality of control zones (d1 and d2) should be set to such an area that includes a branching point and a convergence point. (Patent Document 1: [0021], [0022], FIG. 1, etc.)

Note that, even if a control zone is provided as shown in FIG. 1 of Patent Document 1, the number of article transport vehicles that can enter one control zone (d1 or d2 in the case of FIG. 1) at the same time is limited to one. However, in order to improve the transport efficiency of the facility as a whole, it is preferable to ease such a restriction in control zones while appropriately eliminating the risk of a collision or the like. Patent Document 1 also illustrates a mode in which whether or not to permit entrance into control zones is determined. (Patent Document 1: to [0026], FIG. 2, etc.) Such control of entrance into control zones (control areas) is, in some cases, performed via communication between: a control apparatus that controls whether or not an article transport vehicle is present in a control area, and the travel of each article transport vehicle; and article transport vehicles. Even in such cases, the number of article transport vehicles that can enter a control zone is typically fixed to a predetermined number (one in many cases). Therefore, regardless of what control is employed to control entrance into control zones (control areas), there is demand for the easing of a restriction on control zones (control areas) while appropriately eliminating the risk of a collision or the like.

SUMMARY OF THE INVENTION

In view of the above-described background, there is demanded for providing technology that prevents article transport vehicles from colliding with each other in a control area, and is able to ease the restriction on the number of article transport vehicles that can enter a control area.

In one aspect, an article transport facility that is provided in view of the description above is an article transport facility comprising:
 a plurality of article transport vehicles that travel along a travel path in only one direction to transport an article; and a transport control apparatus that controls each of the article transport vehicles,
 wherein the travel path includes a control target path that is located within a control area that is a predetermined area, and an ordinary path that is located outside the control area,
 the transport control apparatus controls the entrance of the article transport vehicles into the control area such that an intra-area number that is the number of article transport vehicles that are present on the control target path in one control area is no greater than a predetermined control number,
 the article transport facility further comprises:
 a plurality of access points that transmit and receive a wireless signal to and from each of the article transport vehicles;
 wireless tags that are respectively mounted on the article transport vehicles and transmit, as the wireless signal, tag information that includes at least information that identifies the article transport vehicles; and
 a position detection apparatus that acquires the tag information of each article transport vehicle via the access points and detects respective positions of the article transport vehicles based on the same tag information that has been received by the access points,
 the position detection apparatus detects the respective positions of the article transport vehicles with an accuracy with which a plurality of positions in the control area are distinguishable, and
 the transport control apparatus acquires positional information that indicates the position of each article transport vehicle from the position detection apparatus, and permits a number of article transport vehicles that is more than the control number to enter the control area if a predetermined permission condition is satisfied, based on the positional information.

Control target paths in the control area can be of various types, such as a single path, a path that includes a branching point at which the path branches off into a plurality of paths, a path that includes a convergence point at which a plurality of paths converge, a path that includes a branching point and a convergence point, and a path that includes an intersection point at which a plurality of paths intersect with each other. Depending on the structures of the control target paths, there are cases in which, in a situation where a number of article transport vehicles that is equal to the control number are present in the control area, another article transport vehicle can be permitted to enter the control area. In other words, there are cases in which it is possible to ease the condition for controlling the entrance of article transport vehicles into the control area, the condition being for controlling the intra-area number so as to be no greater than the control number. However, it is difficult to set the same eased condition to various control areas. On the other hand, if control area types, such as the shapes of the control areas, are increased in order to use the same eased condition, the control of the control area may become complex and troublesome.

According to the present configuration, the position detection apparatus detects the respective positions of the article transport vehicles with an accuracy with which a plurality of positions in the control area are distinguishable. Therefore, it is possible to control the entrance of article transport vehicles into the control area, not only based on the number of article transport vehicles that are present in the control area (the intra-area number), which simply shows, for example, whether or not an article transport vehicle is present in the control area, but also the positions of article transport vehicles on the control target path. In this regard, the setting of the control area, such as the shape of the control area, remains unchanged, and the control of the control area does not become complex or troublesome. According to this configuration, a number of article transport vehicles that is greater than the control number are permitted to enter the control area if the permission condition is satisfied. Therefore, it is possible to improve the transport efficiency of the facility as a whole. Naturally, if the permission condition is not satisfied, the entrance of article transport vehicles into the control area is restricted based on the intra-area number and the control number. Thus, article transport vehicles in the control area are appropriately prevented from colliding with each other. As described above, according to this configuration, it is possible to prevent article transport vehicles from colliding with each other in the control area, and to ease the restriction on the number of article transport vehicles that can enter the control area.

Additional features and advantages of the article transport facility will become clear from the following descriptions of the embodiments described with reference to the drawings.

DETAILED DESCRIPTION OF EMBODIMENTS

Figure 1:
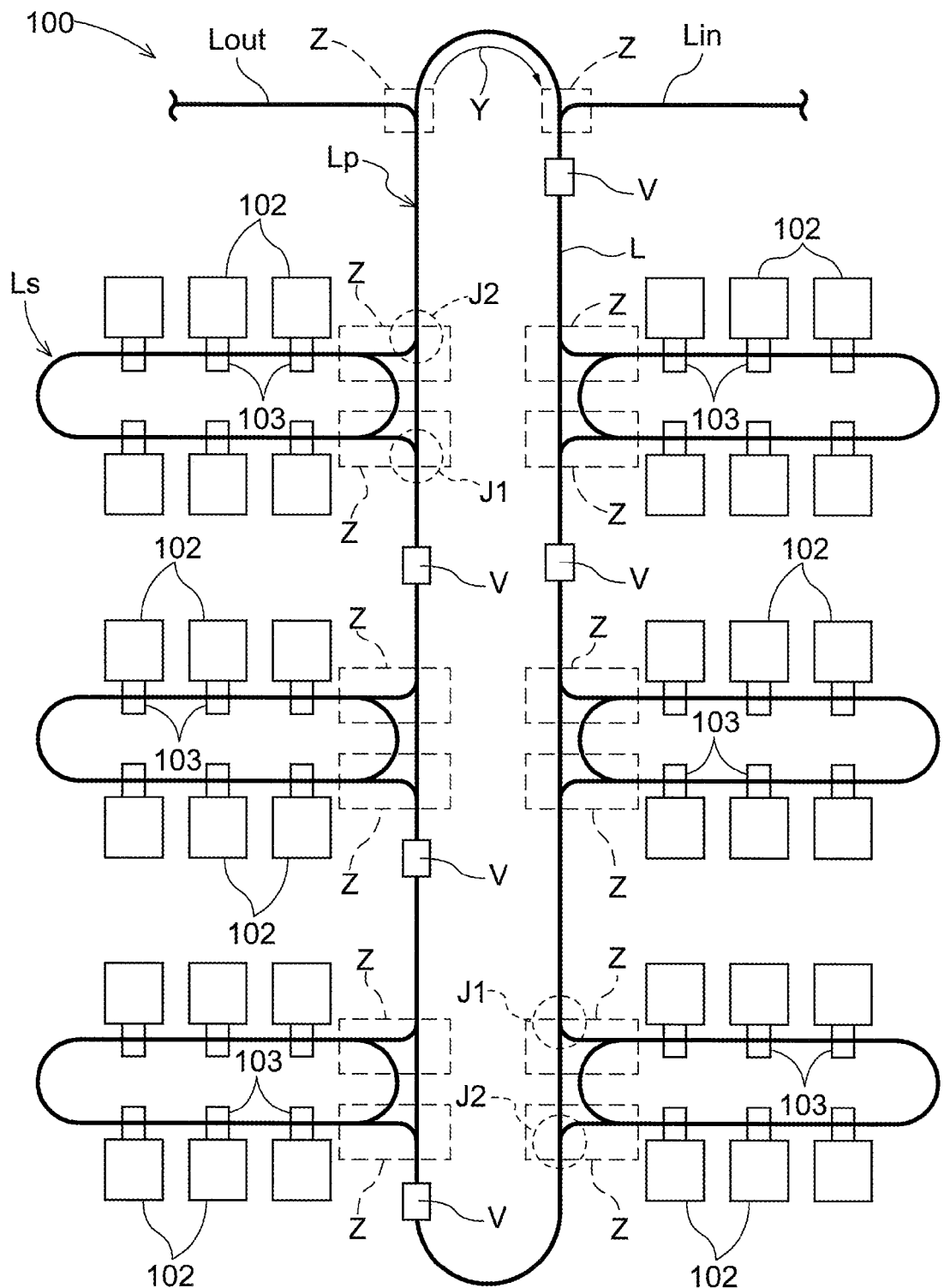
FIG. 1 is a diagram that schematically shows a configuration of an article transport facility.
Figure 2:
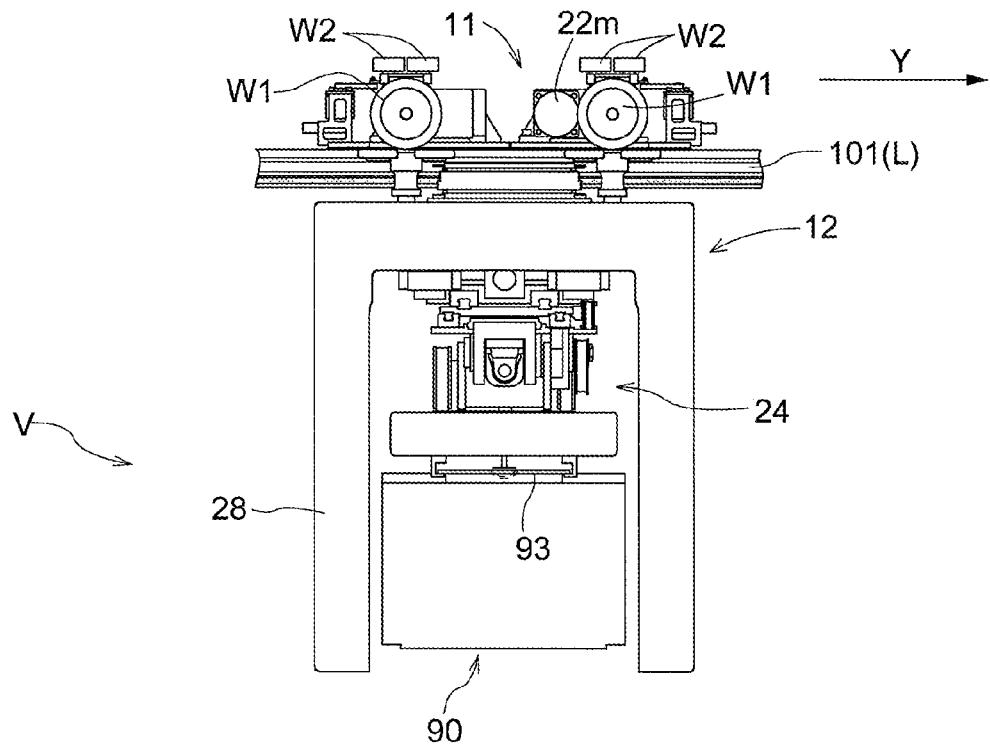
FIG. 2 is a side view of an overhead transport vehicle.
Figure 3:
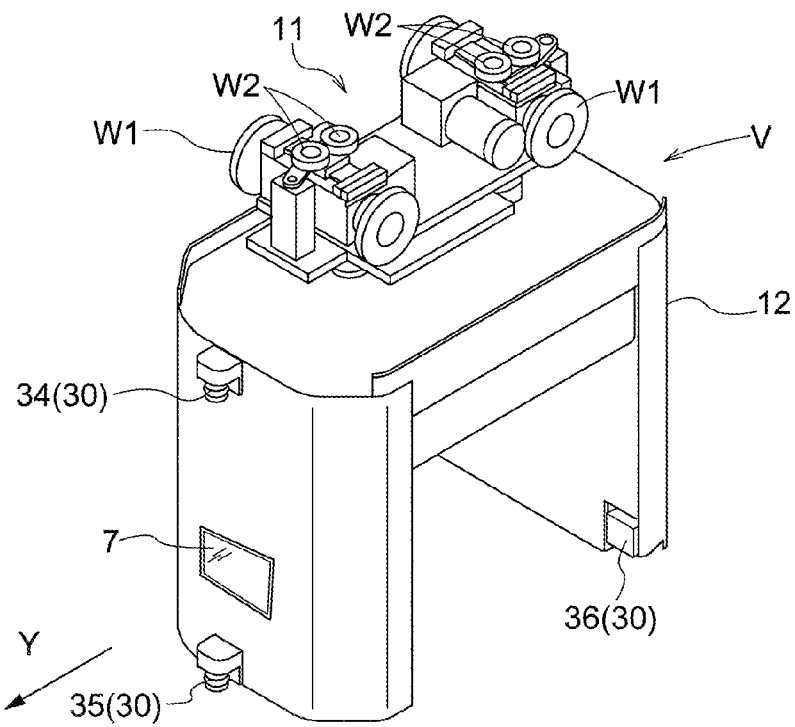
FIG. 3 is a perspective view of the overhead transport vehicle.
Figure 4:
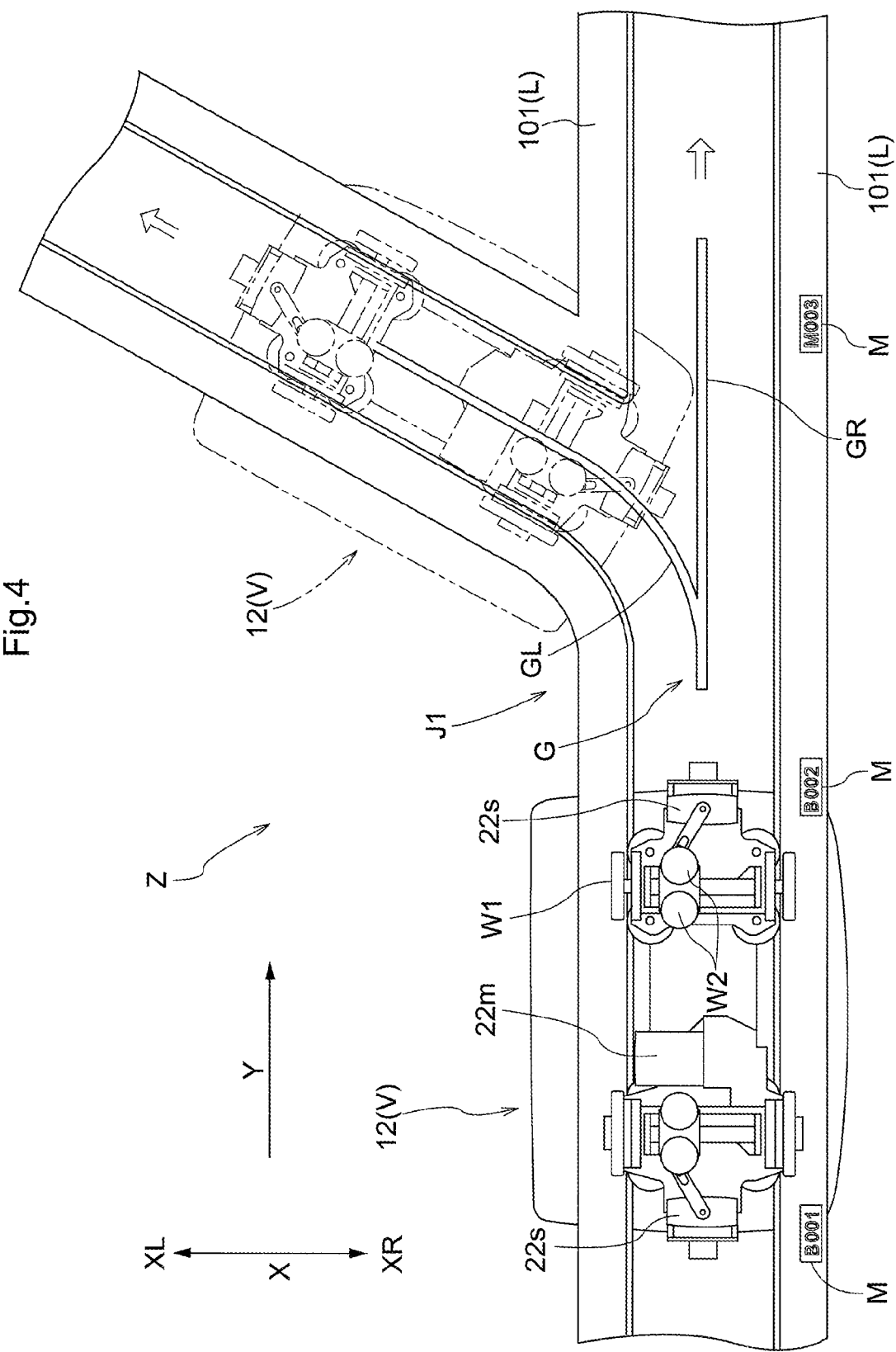
FIG. 4 is an enlarged view of a branching portion.

The following describes an embodiment of an article transport facility with reference to the drawings. Here, as shown in FIGS. 1 and 2, an article transport facility 100 that includes an overhead transport vehicle V (an article transport vehicle) that is suspended from and thus supported by a travel rail 101 (a track) provided on a ceiling, travels along a travel path L that is formed by the travel rail 101, and transports articles from a transport source to a transport destination will be described as an example.
As shown in FIG. 1, the travel path L is not formed with one continuous path, but includes branching portions J1 in which a path branches off, and convergence portions J2 in which paths converge. The travel path L is a one-way path, and the overhead transport vehicle V travels in a travel direction Y.
FIG. 2 is a side view of the overhead transport vehicle V (seen in a direction that is orthogonal to the travel direction Y (a lateral direction X, which will be described later)). As shown in FIG. 2, the overhead transport vehicle V includes: a travel portion 11 that is provided with travel wheels W1 that travel along the travel rail 101 that is suspended from a ceiling; and a main portion 12 that is suspended from and thus supported by the travel portion 11. FIG. 3 is a perspective view of the overhead transport vehicle V. Although details will be described later, the overhead transport vehicle V is, as shown in FIG. 3, provided with obstruction detection sensors 30 that detect an obstruction that is present in a detection area. At least one detection area is set in the vicinity of the overhead transport vehicle V. FIG. 4 is an enlarged view of a branching portion J1 in which the travel path L branches off. In the following description, the direction in which the overhead transport vehicle V travels is referred to as the travel direction Y, and the direction that is orthogonal to the travel direction Y in plan view (the direction that is orthogonal to the travel direction Y in a horizontal plane) is referred to as the lateral direction X.

In the present embodiment, an article transport facility in which articles are transported along the travel path L between a plurality of semiconductor processing apparatuses (hereinafter referred to as the processing apparatuses 102) that perform various kinds of processing on semiconductor substrates, such as thin-film formation, photolithography, and etching will be described as an example. In the present embodiment, an article 90 that is transported by the overhead transport vehicle V is an article that houses a semiconductor substrate, and is referred to as FOUP (Front Opening Unified Pod) (see FIG. 2). In order to transport the article 90 between the processing apparatuses 102, each processing apparatus 102 is provided with a supporting platform 103 (a mounting platform) that is located above the floor surface so as to be adjacent to the processing apparatus 102. The supporting platforms 103 are target positions (transport sources and transport destinations) to/from which the article 90 is transported by the overhead transport vehicle V.

The travel path L includes a main path Lp, which is shown in the center of FIG. 1 and has a relatively large ring-like shape, and sub paths Ls, which are shown outside the main path Lp and each have a relatively small ring-like shape. As shown in FIG. 4, each branching portion J1, which is a portion in which a sub path Ls branches off from the main path Lp, is provided with a guide rail G. Also, although not shown or described in detail, each convergence portion J2, which is a portion in which a sub path Ls converges into the main path Lp, is provided with the same guide rail G. The same applies to other branching portions and convergence portions (e.g. a branching portion and a convergence portion between: external connection paths (an entrance path Lin and an exit path Lout) that are connected to the main path Lp; and the main path Lp, which are shown in an upper portion of FIG. 1). Also, the same applies to a convergence portion in which a branching path from the main path Lp to a sub path Ls converges with the ring-shaped sub path Ls, and a branching portion in which a convergence path from a sub path Ls to the main path Lp branches off the ring-shaped sub path Ls.

As shown in FIG. 2, the overhead transport vehicle V includes: the travel portion 11 that travels along the travel path L; and the main portion 12 that is provided with a supporting portion 24 that is suspended from and thus supported by the travel portion 11 so as to be located below the travel rail 101 and supports the article 90. The travel portion 11 is provided with: the travel wheels W1 that are rotated along the travel rail 101 that is provided along the travel path L; and a travel motor 22m that rotates the travel wheels W1.

As shown in FIG. 2, etc., the travel portion 11 is also provided with guide rollers W2 that are guided by the guide rails G that are provided in the branching portions J1 and the convergence portions J2 of the travel path L. The guide rollers W2 are configured to be able to change their orientation in the left-right direction (the lateral direction X) when seen in a direction along the travel direction Y of the travel portion 11. Orientation change of the guide rollers W2 is performed using guide roller solenoids 22s (see FIGS. 4 and 5). The guide roller solenoids 22s switch the position of the guide rollers W2 to a first position, which is on the right side of the travel direction Y (in a rightward direction XR) or to a second position, which is on the left side of the travel direction Y (in a leftward direction XL), and hold the guide rollers W2 at the position. When located at the first position, the guide rollers W2 abut against the right side surface of the guide rail G when seen in the travel direction Y, and guide the travel portion 11 along a guide rail that does not branch off (a guide rail (a straight guide rail GR) that extends relatively rightward in the travel direction Y). When located at the second position, the guide rollers W2 abut against the left side surface of the guide rail G when seen in the travel direction Y, and guide the travel portion 11 along a guide rail (a branch guide rail GL) that extends leftward.

As shown in FIG. 2, the main portion 12 of the overhead transport vehicle V includes the supporting portion 24 and a cover 28. As shown in FIG. 2, a flange portion 93 is provided at an upper end portion of the article 90. The overhead transport vehicle V transports the article 90 such that the flange portion 93 is suspended from and thus supported by the supporting portion 24. Note that the supporting portion 24 includes: a mechanism for vertically moving the supporting portion 24 relative to the travel portion 11; a mechanism for sliding the supporting portion 24 in the lateral direction X relative to the travel portion 11; and a mechanism for rotating the supporting portion 24 about a vertical axis (an axis that extends in the vertical direction) (not shown) relative to the travel portion 11. As shown in FIG. 2, the cover 28 is a member that covers the top side and both the front and rear sides, in the travel direction Y, of the article 90 in a situation where the supporting portion 24 that supports the article 90 has been lifted.

Figure 5:
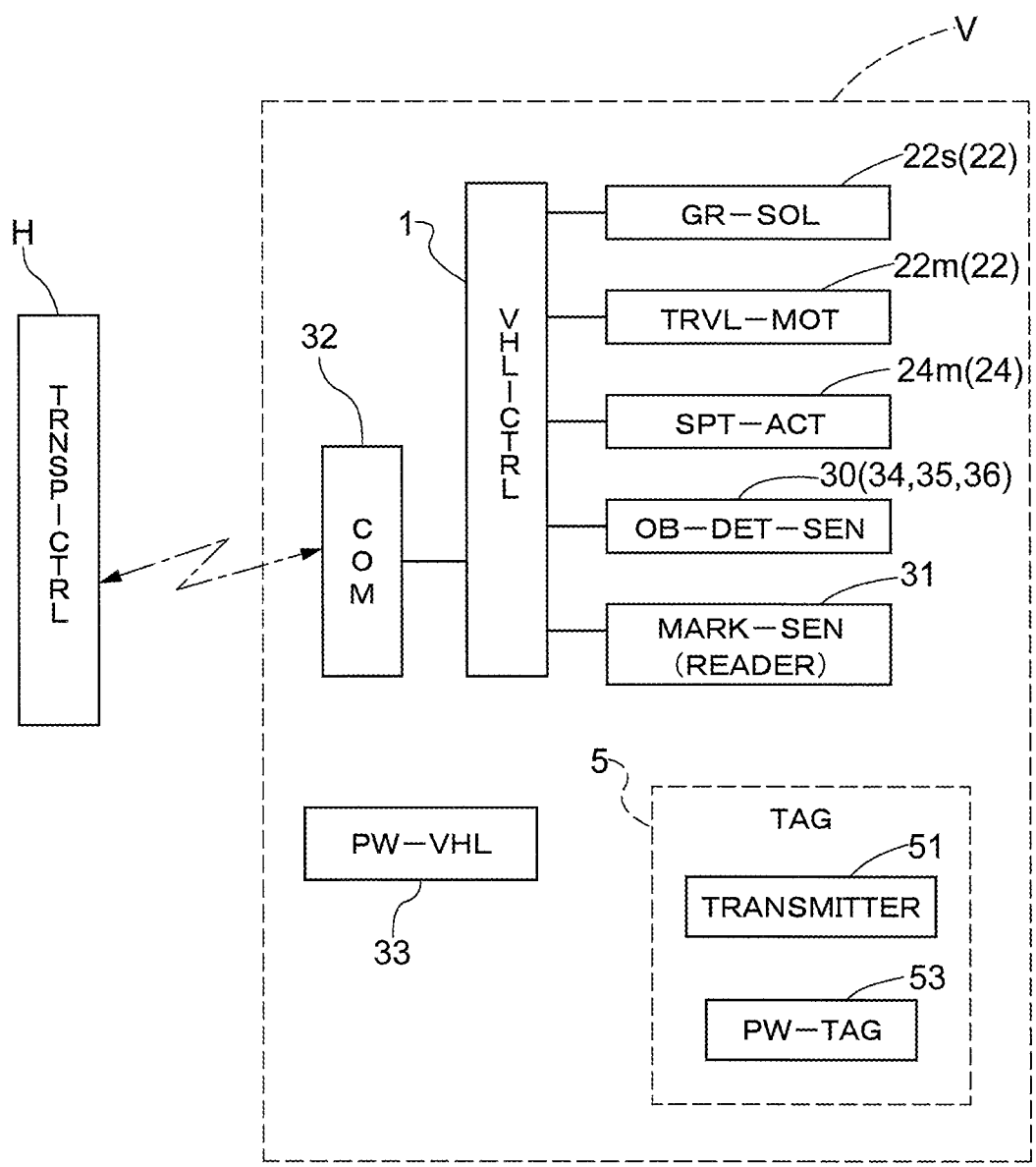
FIG. 5 is a block diagram that schematically shows an example of a system configuration of the overhead transport vehicle.

The block diagram in FIG. 5 schematically shows system configurations of the article transport facility 100 and the overhead transport vehicle V. A transport control apparatus H (TRNSP-CTRL) is a system controller that serves as the core of the article transport facility 100. The transport control apparatus H is a host controller for the overhead transport vehicle V, and controls the operations of the overhead transport vehicle V. The overhead transport vehicle V performs wireless communication with the transport control apparatus H via a transmitting/receiving unit 32 (COM), performs an operation (an article transport operation) using autonomous control, based on a transport instruction from the control apparatus, and thus holds and transports the article 90. The overhead transport vehicle V is constituted by a microcomputer and so on, and is provided with a transport vehicle control unit 1 (VHL-CTRL) that serves as the core for the article transport operation. The transport vehicle control unit 1 causes the overhead transport vehicle V to operate using autonomous control, based on a transport instruction from the transport control apparatus H.

As described above, the transport vehicle control unit 1 performs drive control on the travel motor 22m (TRVL-MOT) to rotate the travel wheels W1, and also performs drive control on the guide roller solenoids 22s (GR-SOL) to change the orientation of the guide rollers W2. The supporting portion 24 is able to vertically move, slide in the lateral direction X, and rotate about the vertical axis, relative to the travel portion 11. These operations are realized by a supporting actuator 24m (SPT-ACT). The transport vehicle control unit 1 performs drive control on the supporting actuator 24m to vertically move, slide, and rotate the supporting portion 24. Although not described in detail, the supporting actuator 24m is the generic term for a vertical movement motor, a slide motor, a rotation motor, etc.

For the purpose of control, a plurality of travel sections CF (see FIG. 6), which are divided from the travel path L, are set to the travel path L. Each travel section CF is assigned a coordinate for identifying the travel sections CF. As schematically shown in FIG. 4, coordinate markers M that indicate coordinates are arranged along the travel path L. The article transport facility 100 is provided with a travel section detection apparatus that detects the position of the overhead transport vehicle V on the travel path L in units of travel sections CF, based on the coordinates that are indicated by the coordinate markers M.

In the present embodiment, a marker detection sensor 31 (MARK-SEN (READER)) that detects the coordinate markers M is mounted on the overhead transport vehicle V. The marker detection sensor 31 is an example of a travel section detection apparatus. In one aspect, the coordinate markers M are two-dimensional barcodes, and are provided on the upper surface of the travel rail 101, for example. In this case, the marker detection sensor 31 is a two-dimensional barcode reader that employs an area sensor or the like, and is preferably provided in the travel portion 11 so as to face the upper surface of the travel rail 101. Also, in another aspect, the coordinate markers M may be IC tags that employ short-distance wireless communication IC chips, and are preferably provided on the lower surface of the travel rail 101, for example. In this case, the marker detection sensor 31 is an IC tag reader, and is preferably provided in the travel portion 11 so as to face the lower surface of the travel rail 101.

The transport vehicle control unit 1 recognizes a position on the travel path L by detecting the coordinate markers M using such a sensor. The position is also transmitted to the transport control apparatus H as a kind of operation information. In the case where the transport vehicle control unit 1 recognizes the position on the travel path L based on the result of detection of the coordinate markers M, the transport vehicle control unit 1 may also be included in the travel section detection apparatus. In the case where the transport control apparatus H recognizes the position on the travel path L by receiving operation information, the transport control apparatus H may also be included in the travel section detection apparatus.

The transport vehicle control unit 1 executes transport control based on a transport instruction from the transport control apparatus H, which is the host controller, and performs drive control on the actuators (22s, 22m, and 24m). Transport control is control that is performed to receive the article 90 from the supporting platform 103 of the transport source and hand the article 90 over to the supporting platform 103 of the transport destination, thereby transporting the article 90 from the supporting platform 103 of the transport source to the supporting platform 103 of the transport destination. The transport vehicle control unit 1 sequentially executes a receiving travel process, a receiving vertical movement process, a handover travel process, and a handover vertical movement process in this order, in response to a transport instruction to transport the article 90 from the supporting platform 103 of the transport source to the supporting platform 103 of the transport destination.

During the receiving travel process, the transport vehicle control unit 1 controls the travel motor 22m and the guide roller solenoids 22s, and causes the travel portion 11 to travel to a target stopping position that corresponds to the supporting platform 103 that has been specified as the transport source. During the receiving vertical movement process, the overhead transport vehicle V that has stopped at the target stopping position transfers the article 90 between the main portion 12 and the supporting platform 103 of the transport source. At this time, the transport vehicle control unit 1 moves (lowers, rotates, and slides) the supporting portion 24 relative to the travel portion 11, causes the supporting portion 24 to grip the flange portion 93 of the article 90, and moves (rotates, slides, and lifts) the supporting portion 24 again relative to the travel portion 11. Consequently, the article 90 is suspended from and thus supported by the supporting portion 24 that is located at a travel position.

During the handover travel process, the transport vehicle control unit 1 controls the travel motor 22m and the guide roller solenoids 22s, and causes the travel portion 11 to travel to a target stopping position that corresponds to the supporting platform 103 that has been specified as the transport destination, with the article 90 being suspended. During the handover vertical movement process, the overhead transport vehicle V that has stopped at the target stopping position transfers the article 90 between the main portion 12 and the supporting platform 103 of the transport destination. The transport vehicle control unit 1 moves (lowers, rotates, and slides) the supporting portion 24 relative to the travel portion 11, and releases the supporting portion 24 from gripping the flange portion 93 of the article 90. Consequently, the article 90 is mounted on the supporting platform 103 of the transport destination. Again, the transport vehicle control unit 1 moves (rotates, slides, and lifts) the supporting portion 24 relative to the travel portion 11, and the supporting portion 24 returns to a travel position, without the article 90 being suspended or supported.

Here, note that, as shown in FIG. 1, the article transport facility 100 includes a plurality of overhead transport vehicles V, and they simultaneously perform an article transport operation using autonomous control. Therefore, there is the risk of a succeeding overhead transport vehicle V colliding with a preceding overhead transport vehicle V on the track (the travel path L). Also, if an object (which may be a human) enters the article transport facility 100, or an apparatus (a kind of object) in the article transport facility 100 is relocated, there is the risk of an overhead transport vehicle V that is executing a travel process or an overhead transport vehicle V that is executing a vertical movement process coming into contact with such an object. In order to avoid such a collision or contact, the overhead transport vehicles V are provided with the above-described obstruction detection sensors 30.

The present embodiment shows an example in which three types of obstruction detection sensors 30 (OB-DET-SEN) are provided. An obstruction detection sensor 30 that detects the preceding overhead transport vehicle V on the track is a collision prevention sensor 34. From the viewpoint of the collision prevention sensor 34, the preceding overhead transport vehicle V is an obstruction. The collision prevention sensor 34 is, for example, a distance sensor that employs a laser radar or the like, and measures the distance from the overhead transport vehicle V to the preceding overhead transport vehicle V. An obstruction detection sensor 30 that detects an object (an obstruction) that is located on or in the vicinity of the track and prevents the overhead transport vehicle V from travelling on the track is a travel obstruction detection sensor 35. An obstruction detection sensor 30 that detects an object (an obstruction) with which the supporting portion 24 or the article 90 that is supported by the supporting portion 24 may come into contact when the article 90 is being vertically moved is a transfer obstruction detection sensor 36. The travel obstruction detection sensor 35 and the transfer obstruction detection sensor 36 are, for example, scan-type range sensors (range scanners), and detect an object (an obstruction) by performing scanning with infrared light, a laser beam, or the like.

For example, the collision prevention sensor 34 outputs obstruction detection information (preceding vehicle detection information) upon detecting that another overhead transport vehicle V (a preceding vehicle) is present within a predetermined distance ahead on the track (within a detection area). The obstruction detection information preferably includes information regarding distance to the preceding vehicle (which may be information that indicates whether or not the distance is no shorter than a predetermined distance (a predetermined inter-vehicle distance)). The transport vehicle control unit 1 executes an avoidance process based on obstruction detection information. For example, if the inter-vehicle distance to the preceding vehicle is shorter than the predetermined inter-vehicle distance, the transport vehicle control unit 1 executes, as the avoidance process, a deceleration process to reduce the travelling speed of the overhead transport vehicle V, and if the inter-vehicle distance to the preceding vehicle is shorter than a stopping inter-vehicle distance that is shorter than the predetermined inter-vehicle distance, the transport vehicle control unit 1 executes, as the avoidance process, a stopping process to stop the overhead transport vehicle V.

Here, note that, in a branching portion J1, which is illustrated in FIG. 4, there is a possibility that the succeeding vehicle is not located right behind the preceding vehicle. Therefore, there is the risk of the collision prevention sensor 34 of the succeeding vehicle having a lower sensitivity to detect the preceding vehicle. Therefore, as shown in FIG. 1, areas that include a branching portion J1 (a branching point), a convergence portion J2 (a convergence point), an intersection point (not shown), or the like are set as control areas Z, and the overhead transport vehicles V are restricted from entering the control areas, based on predetermined conditions. The transport control apparatus H controls the entrance of the overhead transport vehicles V into the control areas Z such that an intra-area number, which is the number of overhead transport vehicles V that are present in one control area Z, is no greater than a predetermined control number. Note that the control number is preferably "1", for example. When the control number is "1", whether or not the preceding vehicle is present in the control area Z is a condition for determination. Therefore, loads on a computation apparatus, such as the amount of computation and computation time required for determination, can be reduced.

However, travel restriction using the control areas Z is typically likely to be based on conditions for determination that have been defined in view of safety. Thus, cases where the overhead transport vehicles V decelerate or stop at a point that is upstream of the control areas Z increase, which may lead to a decrease in the transport efficiency of the article transport facility 100 as a whole. Therefore, the article transport facility 100 according to the present embodiment is configured to prevent the overhead transport vehicles V from causing a collision in the control areas Z, and to ease the restriction on the number of overhead transport vehicles V that can enter the control areas Z.

Figure 6:
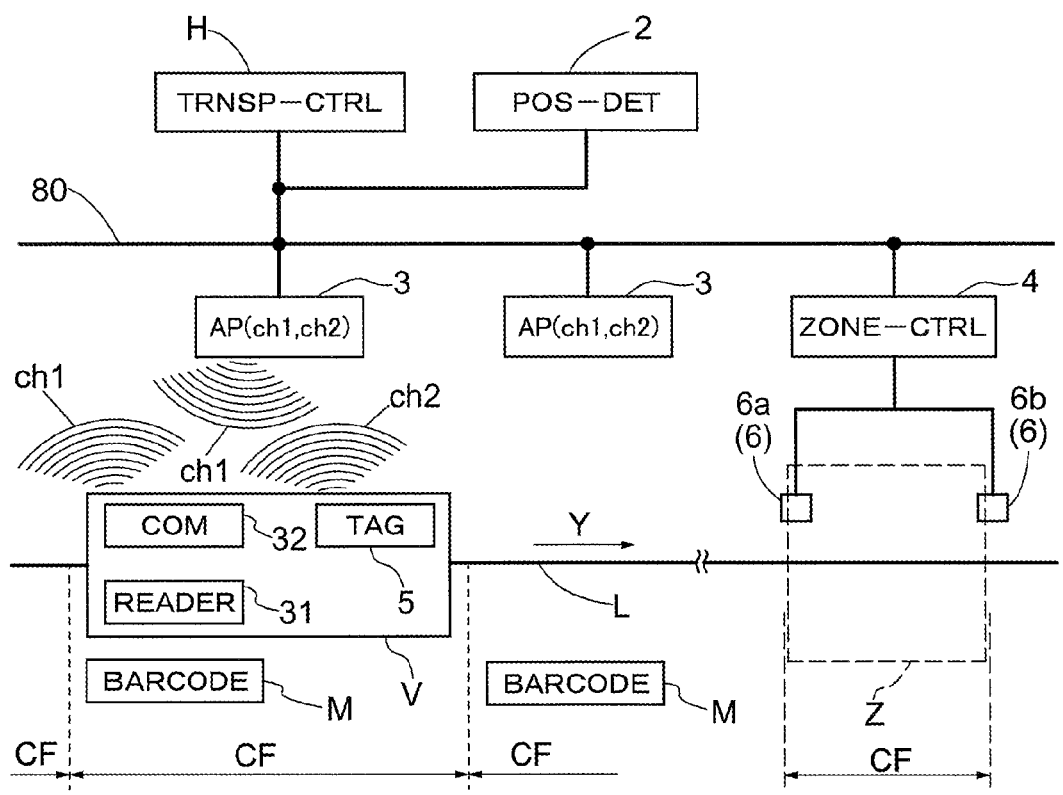
FIG. 6 is a block diagram that schematically shows an example of a system configuration of the article transport facility.
Figure 7:
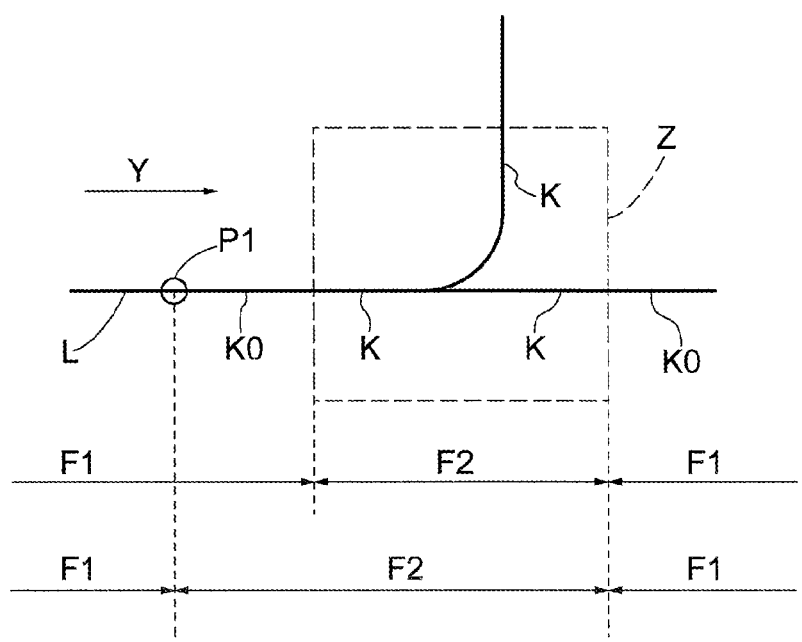
FIG. 7 is a diagram that illustrates a relationship between a control area and a frequency at which positional information is acquired.

The block diagram in FIG. 6 schematically shows a system configuration of the article transport facility 100. FIG. 7 shows an example of a configuration of the travel path L in a control area Z, and a relationship between the control area Z and the frequency at which positional information, which will be described later, is acquired. As described above, the article transport facility 100 includes: the plurality of overhead transport vehicles V that travel only in one direction (the travel direction Y) along the travel path L to transport the article 90; and the transport control apparatus H that controls each of the overhead transport vehicles V. As shown in FIG. 7, the travel path L includes control target paths K that are located within the control area Z that is a predetermined area, and ordinary paths K0 that are located outside the control area Z. The transport control apparatus H controls the entrance of the overhead transport vehicles V into the control area Z such that the intra-area number (N), which is the number of overhead transport vehicles V that are present on the control target paths K in one control area Z, is no greater than a predetermined control number (TH).

As shown in FIG. 6, the article transport facility 100 further includes a plurality of access points (AP) 3 that transmit and receive a wireless signal to and from each of the overhead transport vehicles V. The access points 3 are connected to a wired network 80, and communicate with the transport control apparatus H that is also connected to the network 80. For example, a transport instruction from the transport control apparatus H is transmitted to an overhead transport vehicle V via the network 80 and an access point 3. Also, operation information such as the result of detection of coordinate markers M (BARCODE) by the marker detection sensor (reader) 31 is provided to the transport control apparatus H via an access point 3 and the network 80.

Also, each overhead transport vehicle V is equipped with a wireless tag (TAG) 5 that transmits, as a wireless signal, tag information that includes at least information that identifies the overhead transport vehicle V. As shown in FIG. 5, the wireless tag 5 is provided with a tag power supply 53 (PW-TAG) that supplies power that is required to transmit tag information. Therefore, the wireless tag 5 can transmit tag information even when a VHL power supply 33 (PW-VHL) that supplies power to each component of the overhead transport vehicle V, such as the transport vehicle control unit 1 and the transmitting/receiving unit 32, is in an OFF state and no power is supplied to each component of the overhead transport vehicle V. Although the present embodiment shows an example in which the tag power supply 53 is provided, naturally, there is nothing hindering the realization of a mode in which the wireless tag 5 is not provided with the tag power supply 53 and transmits tag information using power that is supplied from the VHL power supply 33.

A position detection apparatus 2 (POS-DET) is also connected to the network 80. The position detection apparatus 2 acquires the tag information of each of the overhead transport vehicles V via the access points 3, and detects the position of each overhead transport vehicle V based on the same tag information that is received by the plurality of access points 3. The position detection apparatus 2 detects the position of each overhead transport vehicle V with an accuracy with which a plurality of positions in the control area Z are distinguishable. For example, the position of each overhead transport vehicle V is detected with an accuracy with which the control target paths K (K1 to K6) shown in FIGS. 8 to 11 are distinguishable. The position detection apparatus 2 periodically receives the tag information of the same overhead transport vehicle V that has been received via the plurality of access points 3, to recognize the position of the overhead transport vehicle V. The position detection apparatus 2 also serves as a server for storing the tag information. Note that the amount of power remaining in the tag power supply 53 of each wireless tag 5 may also be included in tag information, and it is possible to check the amount of power remaining in the tag power supply 53 using the server (the position detection apparatus 2)

Typically, each control area Z includes one travel section CF. Therefore, the position detection apparatus 2 can detect the position of each overhead transport vehicle V with a higher accuracy compared to the travel section detection apparatus (the marker detection sensor 31). Note that, in the case where the travel sections CF are set in such a manner, the transport control apparatus H preferably controls the travel of the overhead transport vehicles V along the travel path L and the entrance of the overhead transport vehicles V into the control areas Z based on the result of detection by the travel section detection apparatuses (the marker detection sensors 31).

The article transport facility 100 may also include a zone control apparatus 4 (a control area control apparatus) (ZONE-CTRL) that detects the entrance of the overhead transport vehicles V into the control areas Z and the exit of the overhead transport vehicles V from the control areas Z, and determines whether or not to permit the entrance of overhead transport vehicles V into the control areas Z. As shown in FIG. 6, the zone control apparatus 4 is also connected to the network 80, and can communicate with the transport control apparatus H. In one aspect, as shown in FIG. 6, the zone control apparatus 4 determines the entrance and exit of the overhead transport vehicles V into/from each control area Z based on the result of detection by sensors (e.g. magnet switches 6) that are provided at the entrance and exit of the control area Z. Specifically, if a magnet switch 6a that is provided at the entrance of a control area Z detects that an overhead transport vehicle V has traveled past it, the zone control apparatus 4 determines that the overhead transport vehicle V has entered the control area Z. Also, if a magnet switch 6b that is provided at the exit of a control area Z detects that an overhead transport vehicle V has traveled past it, the zone control apparatus 4 determines that the overhead transport vehicle V has exited from the control area Z.

In this way, the transport control apparatus H specifies a control area Z that is a travel section CF, and controls the entrance of an article transport vehicle into the control area Z, based on the result of detection by the travel section detection apparatus (the marker detection sensor 31). Alternatively, the transport control apparatus H controls the entrance of an article transport vehicle into a control area Z based on the result of determination by the control area control apparatus.

The transport control apparatus H acquires positional information that indicates the position of each overhead transport vehicle V from the position detection apparatus 2, and permits a number of overhead transport vehicles V that is greater than the control number (TH), to enter the control area Z if a predetermined permission condition is satisfied, based on the positional information. In one aspect, the transport control apparatus H designates an overhead transport vehicle V and requests the position detection apparatus 2 to transmit the positional information of the overhead transport vehicle V, and the position detection apparatus 2 transmits the positional information to the transport control apparatus H in response to the request. Alternatively, the position detection apparatus 2 transmits the positional information of all of the overhead transport vehicles V to the transport control apparatus H at predetermined transmission intervals (at a predetermined frequency).

As shown in FIG. 7, if an overhead transport vehicle V is present on an ordinary path K0, the transport control apparatus H acquires the positional information from the position detection apparatus 2 at a first frequency F1. In contrast, if an overhead transport vehicle V is present on a control target path K, the transport control apparatus H acquires the positional information of the overhead transport vehicle V at a second frequency F2 that is higher than the first frequency F1. If the intervals at which positional information is acquired are short, the distance that is traveled by an overhead transport vehicle V during the interval is also short, and thus the resolution of positional information increases. It is possible to increase the resolution of the positional information of an overhead transport vehicle V in a control area by acquiring the positional information of the overhead transport vehicle V at the second frequency F2.

If the transport control apparatus H starts acquiring positional information at the second frequency F2 before an overhead transport vehicle V travelling to a control area Z has arrived at the control area Z, the transport control apparatus H can acquire the positional information of the overhead transport vehicle V with a high accuracy upon the overhead transport vehicle V entering the control area Z. For example, as shown in FIG. 7, a control preparation point P1 is set at a point that is upstream of the control area Z in the advancing direction (the travel direction Y) of the overhead transport vehicle V. The transport control apparatus H preferably acquires the positional information at the second frequency F2 upon the overhead transport vehicle V arriving at the control preparation point P1.

As described above, the transport control apparatus H acquires the positional information that indicates the position of each overhead transport vehicle V from the position detection apparatus 2. Then, the transport control apparatus H permits a number of overhead transport vehicles V that is greater than the control number (TH), to enter the control area Z if the predetermined permission condition is satisfied, based on the positional information. Note that, even in the case where the zone control apparatus 4 (the control area control apparatus) that determines whether or not to permit overhead transport vehicles V to enter the control area Z is provided as shown in FIG. 6, the transport control apparatus H permits the overhead transport vehicles V to enter the control area Z if the permission condition is satisfied, regardless of the result of determination by the zone control apparatus 4. The details of the permission condition will be described later with reference to FIGS. 8 to 11.

As shown in FIG. 6, the access points 3 are multichannel repeaters that can transmit and receive a wireless signal via a first communication channel ch1 and a second communication channel ch2 that is different from the first communication channel ch1. In the present embodiment, the transport control apparatus H controls the overhead transport vehicles V by performing wireless communication with each overhead transport vehicle V using the first communication channel ch1. The wireless tags 5 transmit tag information using the second communication channel ch2. Since wireless communication between the transport control apparatus H and the overhead transport vehicles V, and transmission of tag information from the wireless tags 5, are performed using different communication channels, communication quality (the communication speed, the reliability of data, etc.) is prevented from decreasing due to radio wave interference or the like.

Figure 12:
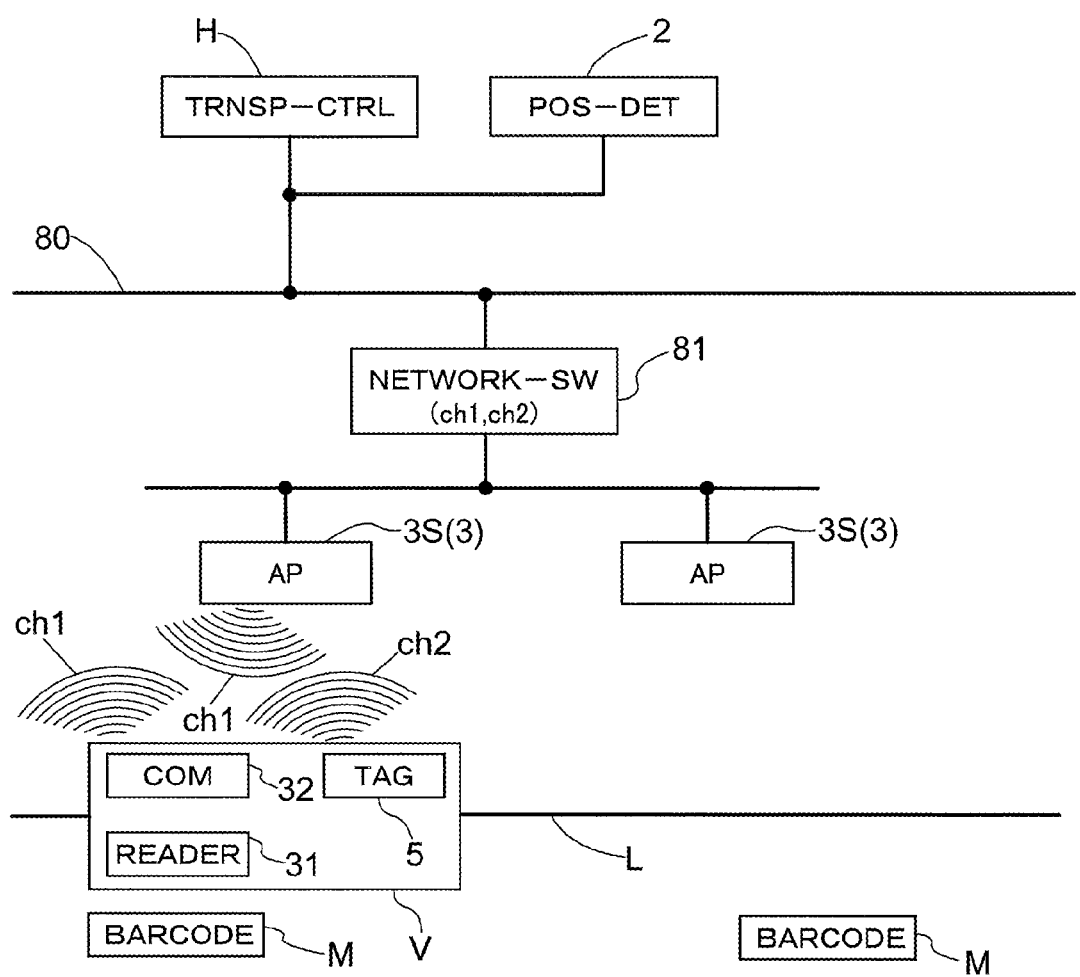
FIG. 12 is a block diagram that schematically shows another example of the system configuration of the article transport facility.
Figure 13:
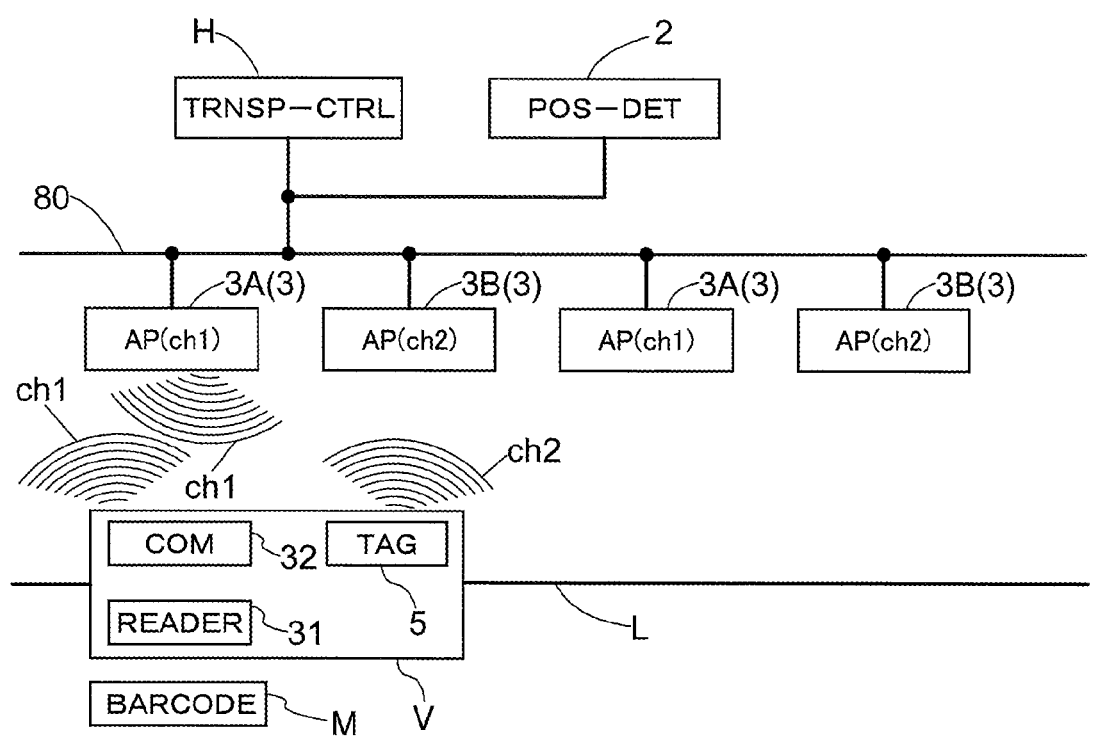
FIG. 13 is a block diagram that schematically shows another example of the system configuration of the article transport facility.

Note that the plurality of channels of the access points 3 are not necessarily realized by the repeaters themselves. For example, as shown in FIG. 12, a configuration that includes a network switch 81 (NETWORK-SW) that switches the communication channels of single-channel access points 3S to the first communication channel ch1 and the second communication channel ch2 is also preferable. If the single-channel access points 3S in the article transport facility 100 are to be replaced with the multi-channel access points 3, there is the possibility of incurring considerable costs, and stopping the article transport facility 100 in order to perform replacement work, for example. However, if the network switch 81 is installed in the article transport facility 100, it is possible to realize multiple communication channels effectively using the existing single-channel access points 3S. Note that, as illustrated in FIG. 13, naturally, there is nothing hindering the realization of a mode in which first access points 3A that perform single-channel communication via the first communication channel ch1 and second access points 3B that perform single-channel communication via the second communication channel ch2 are provided.

The configuration of the article transport facility 100 has been described above. The following describes a specific example of the permission condition with reference to FIGS. 8 to 11.

Figure 8:
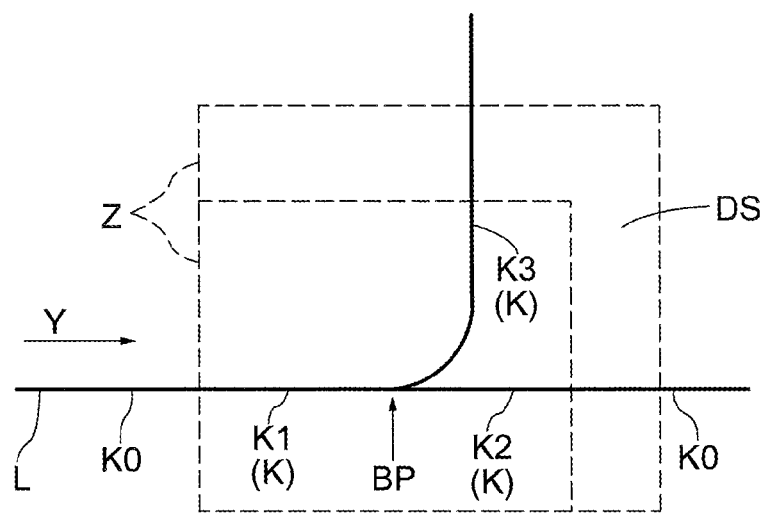
FIG. 8 is a diagram that shows an example of a control area that includes a branching point.

FIG. 8 shows an example of a control area Z that includes a branching point BP. The control area Z includes three path branches (K1, K2, and K3) as control target paths K. Also, a predetermined range within the control area Z, which is located on the downstream side in the travel direction Y, specifically, downstream of the second path branch K2 and downstream of the third path branch K3, is set as a downstream area DS. Here, if preceding vehicles out of the overhead transport vehicles V are present in the downstream area DS, the transport control apparatus H subtracts the number of preceding vehicles from an intra-area number N, and controls the entrance of succeeding vehicles, out of the overhead transport vehicles V, into the control area Z. This is an example of the permission condition.

For example, it is assumed that a control number TH is "1" and a preceding vehicle is present in the downstream area DS, which is downstream of the second path branch K2. The number of overhead transport vehicles V in the control area Z, i.e. the intra-area number N is "1". Here, if a succeeding vehicle enters the control area Z, the intra-area number N becomes "2". Consequently, "N>TH" is satisfied, and if the permission condition is not applied, succeeding vehicles are restricted from entering the control area Z. However, since the preceding vehicle is located in the downstream area DS, it is possible to subtract the number of preceding vehicles "1" from the intra-area number N. Consequently, the intra-area number N becomes "0", and even if a succeeding vehicle enters the control area Z, the intra-area number N is "1". Consequently, "NTH" is satisfied, and the succeeding vehicle is permitted to enter the control area Z.

The following describes other examples of the permission condition. The control area Z shown in FIG. 8 includes at least one of; a branching point BP at which the travel path L branches off to a plurality of paths; and a convergence point CP at which a plurality of paths converge (the control area Z shown in FIG. 8 includes a branching point BP). Also, the travel path L within the control area Z is set as different path branches such that the branching point BP and the convergence point CP are interposed therebetween (three path branches (K1, K2, and K3) are set such that the branching point BP is interposed therebetween). Here, if no other overhead transport vehicle V is present on a travel destination branch that is a path branch to which the overhead transport vehicle V is travelling, or a path branch that is upstream of the travel destination branch and leads to the travel destination branch, the transport control apparatus H permits an overhead transport vehicle V to enter the control area Z regardless of the intra-area number N.

For example, it is assumed that a preceding vehicle is present on the second path branch K2, and a succeeding vehicle enters the control area Z from the first path branch K1 and travels from the branching point BP to the third path branch K3. If this is the case, the travel destination branch is the third path branch K3, and the path branch that is upstream of the travel destination branch and leads to the travel destination branch is the first path branch K1. Since the preceding vehicle is present on the second path branch K2, no overhead transport vehicle V is present on the travel destination branch and the path branch that leads to the travel destination branch. Since the preceding vehicle is present on the second path branch K2, the intra-area number N is "1". However, the succeeding vehicle can enter the control area Z because the permission condition is satisfied.

The following Table 1 is a list of cases where a succeeding vehicle is permitted or prohibited to enter the control area Z that includes a branching point BP.

TABLE 1

Permission or Prohibition to Enter Control Area (FIG. 8) including Branching Point

| Preceding Vehicle | Travel Destination Branch | |
| --- | --- | --- |
| | K2 | K3 |
| K1 | Not Permitted | Not Permitted |
| K2 | Not Permitted | Permitted |
| K3 | Permitted | Not Permitted |

As shown in Table 1, when the preceding vehicle is present on the first path branch K1, the entrance of the succeeding vehicle is restricted regardless of whether the travel destination branch is "K2" or "K3". When the preceding vehicle is present on the second path branch K2, the entrance of the succeeding vehicle is restricted if the travel destination branch is the second path branch K2, whereas the entrance of the succeeding vehicle is permitted if the travel destination branch is the third path branch K3. When the preceding vehicle is present on the second path branch K2, the entrance of the succeeding vehicle is restricted if the travel destination branch is the second path branch K2, whereas the entrance of the succeeding vehicle is permitted if the travel destination branch is the third path branch K3.

Figure 9:
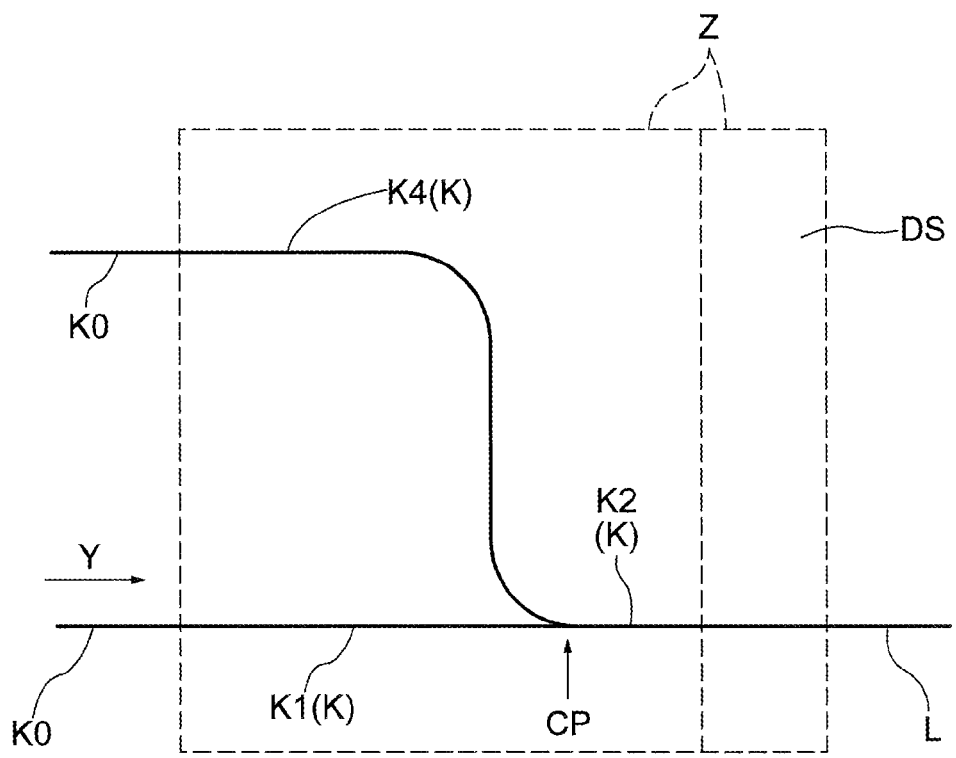
FIG. 9 is a diagram that shows an example of a control area that includes a convergence point.

FIG. 9 shows an example of a control area Z that includes a convergence point CP. The control area Z includes three path branches (K1, K2, and K4) as control target paths K. As described with reference to FIG. 8, a predetermined range within the control area Z, which is located on the downstream side in the travel direction Y, specifically, downstream of the second path branch K2, is set as a downstream area DS. Here, if preceding vehicles out of the overhead transport vehicles V are present in the downstream area DS, the transport control apparatus H subtracts the number of preceding vehicles from the intra-area number N, and controls the entrance of succeeding vehicles, out of the overhead transport vehicles V, into the control area Z. This is the same as described above with reference to FIG. 8, and a detailed description is omitted.

As in FIG. 8, the control area Z shown in FIG. 9 includes at least one of; a branching point BP at which the travel path L branches off to a plurality of paths; and a convergence point CP at which a plurality of paths converge (the control area Z shown in FIG. 9 includes a convergence point CP). Also, the travel path L within the control area Z is set as different path branches such that branching point BP and the convergence point CP are interposed therebetween (three path branches (K1, K2, and K4) are set such that the convergence point CP is interposed therebetween). As described above, if no other overhead transport vehicle V is present on a travel destination branch that is a path branch to which the overhead transport vehicle V is travelling, or a path branch that is upstream of the travel destination branch and leads to the travel destination branch, the transport control apparatus H permits an overhead transport vehicle V to enter the control area Z regardless of the intra-area number N. In the case shown in FIG. 9, the only travel destination branch is the second path branch K2, and the preceding vehicle is to pass through the travel destination branch (the second path branch K2) regardless of on which path branch (K1, K2, or K4) the preceding vehicle is present.

Therefore, this condition does not permit the entrance of a succeeding vehicle in any cases.

Figure 10:
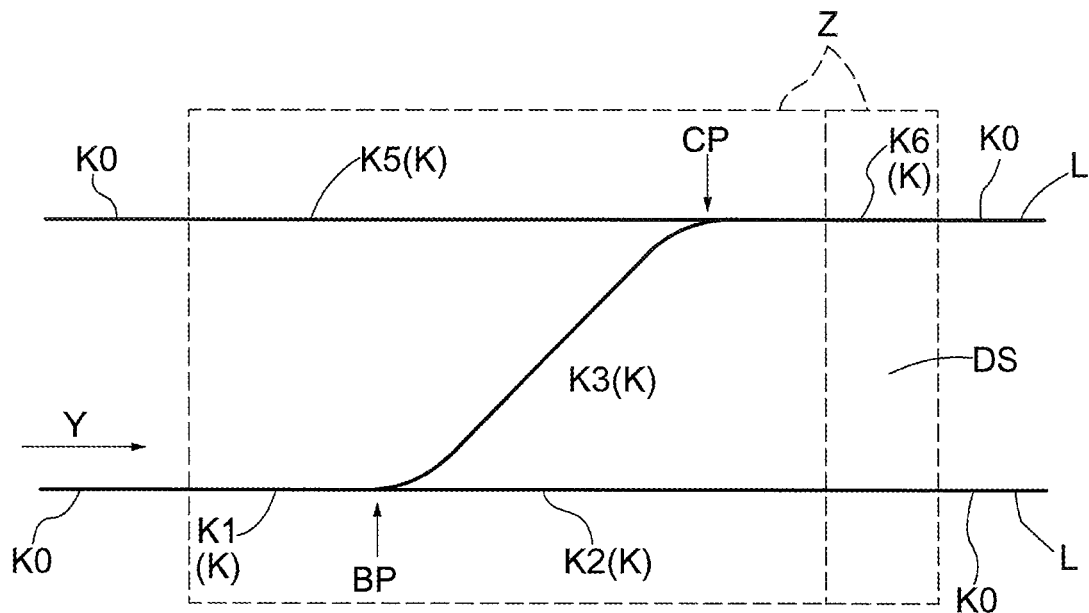
FIG. 10 is a diagram that shows an example of a control area that includes a branching point and a convergence point.

FIG. 10 shows an example of a control area Z that includes a branching point BP and a convergence point CP. The control area Z includes five path branches (K1, K2, K3, K5, and K6) as control target paths K. As described with reference to FIGS. 8 and 9, a predetermined range within the control area Z, which is located on the downstream side in the travel direction Y, specifically, downstream of the second path branch K2 and downstream of the sixth path branch K6, is set as a downstream area DS. Here, if preceding vehicles out of the overhead transport vehicles V are present in the downstream area DS, the transport control apparatus H subtracts the number of preceding vehicles from the intra-area number N, and controls the entrance of succeeding vehicles, out of the overhead transport vehicles V, into the control area Z. This is the same as described above with reference to FIGS. 8 and 9, and a detailed description is omitted.

The control area Z shown in FIG. 10 includes at least one of; a branching point BP at which the travel path L branches off to a plurality of paths; and a convergence point CP at which a plurality of paths converge (the control area Z shown in FIG. 10 includes a branching point BP and a convergence point CP). Also, the travel path L within the control area Z is set as different path branches such that the branching point BP and the convergence point CP are interposed therebetween (three path branches (K1, K2, and K3) are set such that the branching point BP is interposed therebetween, and three path branches (K3, K5, and K6) are set such that the convergence point CP is interposed therebetween ("K3" is an overlap)).

As described above, if no other overhead transport vehicle V is present on a travel destination branch that is a path branch to which the overhead transport vehicle V is travelling, or a path branch that is upstream of the travel destination branch and leads to the travel destination branch, the transport control apparatus H permits an overhead transport vehicle V to enter the control area Z regardless of the intra-area number N. The concept is the same as that described above with reference to FIG. 8, and a detailed description is omitted. The following Table 2 is a list of cases where a succeeding vehicle is permitted or prohibited to enter the control area Z that includes a branching point BP and a convergence point CP.

TABLE 2

Permission or Prohibition to Enter Control Area (FIG. 10) including Branching Point and Convergence Point

|                   | Travel Destination Branch | |
| --- | --- | --- |
| Preceding Vehicle | K2 | K3 |
| K1 | Not Permitted | Not Permitted |
| K2 | Not Permitted | Permitted |
| K3 | Permitted | Not Permitted |
| K5 | Permitted | Not Permitted |
| K6 | Permitted | Not Permitted |

Figure 11:
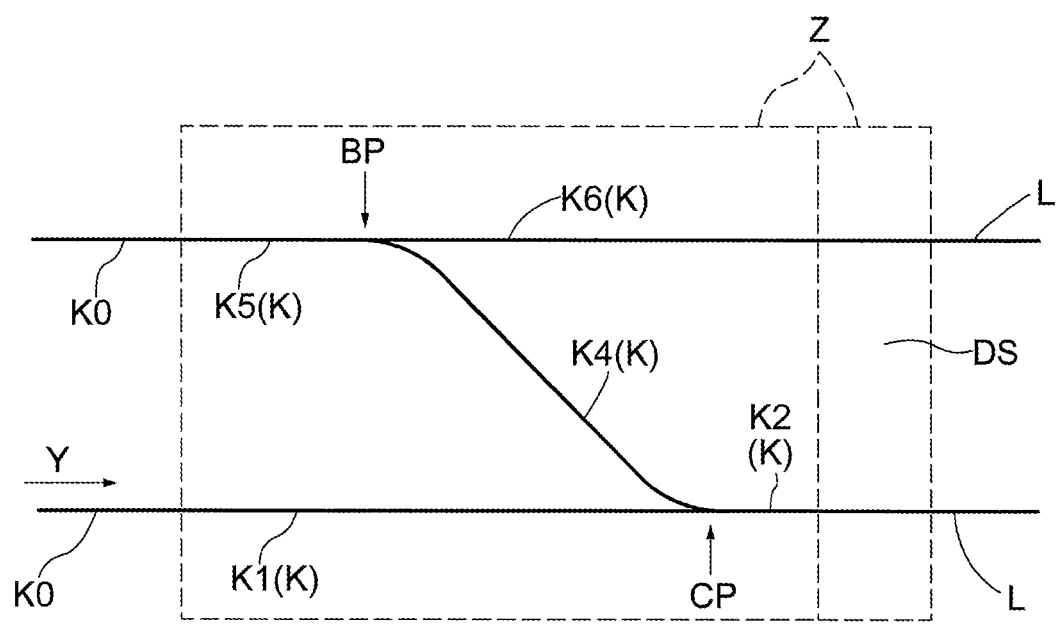
FIG. 11 is a diagram that shows an example of a control area that includes a convergence point and a branching point.

FIG. 11 shows an example of a control area Z that includes a convergence point CP and a branching point BP. The control area Z includes five path branches (K1, K2, K4, K5, and K6) as control target paths K. As described with reference to FIGS. 8 to 10, a predetermined range within the control area Z, which is located on the downstream side in the travel direction Y, specifically, downstream of the second path branch K2 and downstream of the sixth path branch K6, is set as a downstream area DS. Here, if preceding vehicles out of the overhead transport vehicles V are present in the downstream area DS, the transport control apparatus H subtracts the number of preceding vehicles from the intra-area number N, and controls the entrance of succeeding vehicles, out of the overhead transport vehicles V, into the control area Z. This is the same as described above with reference to FIGS. 8 to 10, and a detailed description is omitted.

The control area Z shown in FIG. 11 includes at least one of; a branching point BP at which the travel path L branches off to a plurality of paths; and a convergence point CP at which a plurality of paths converge (the control area Z shown in FIG. 11 includes a branching point BP and a convergence point CP). Also, the travel path L within the control area Z is set as different path branches such that the branching point BP and the convergence point CP are interposed therebetween (three path branches (K1, K2, and K4) are set such that the convergence point CP is interposed therebetween, and three path branches (K4, K5, and K6) are set such that the branching point BP is interposed therebetween ("K4" is an overlap)).

As described above, if no other overhead transport vehicle V is present on a travel destination branch that is a path branch to which the overhead transport vehicle V is travelling, or a path branch that is upstream of the travel destination branch and leads to the travel destination branch, the transport control apparatus H permits an overhead transport vehicle V to enter the control area Z regardless of the intra-area number N. The concept is the same as that described above with reference to FIG. 8, and a detailed description is omitted. The following Table 3 is a list of cases where a succeeding vehicle is permitted or prohibited to enter the control area Z that includes a convergence point CP and a branching point BP.

TABLE 3

Permission or Prohibition to Enter Control Area (FIG. 11) including Branching Point and Convergence Point

|                   | Travel Destination Branch |
| --- | --- |
| Preceding Vehicle | K2 |
| K1 | Not Permitted |
| K2 | Not Permitted |
| K4 | Not Permitted |
| K5 | Not Permitted |
| K6 | Permitted |

Although various modes have been illustrated above, in addition to these modes, it is also possible to conceive of, for example, an intersection point at which the travel path L intersects with another path. A person skilled in the art should be able to apply the present invention with reference to the description above, and therefore a detailed description is omitted.

Other Embodiments

The following describes other embodiments. Note that the configurations of the embodiments described below are not necessarily applied alone, and may be combined with each other unless there is a contradiction.

(1) Although the description above illustrates the overhead transport vehicles V as the article transport vehicles, the article transport vehicles may be ground transport vehicles that travel on the ground.

(2) The description above illustrates a mode in which the overhead transport vehicles V, which are the article transport vehicles, travel along a track that is formed with the travel rail 101. However, the travel path L is not limited to a tangible path like the travel rail 101. If the travel path L has been determined in advance, it is possible that the travel path L is not tangible. For example, the article transport vehicle may be trackless transport vehicles that travel along a predetermined virtual travel path L.

(3) The description above illustrates a mode in which the travel section detection apparatus (the marker detection sensor 31) that detects the positions of the overhead transport vehicles V on the travel path L in units of travel sections CF into which the travel path L is divided is provided. However, it is possible to employ a mode in which such travel sections CF are not set and the positions of the overhead transport vehicle V (the article transport vehicles) on the travel path L are detected by only the position detection apparatus 2.

(4) Note that the configurations that are disclosed in the above-described embodiments may be combined with each other and applied unless there is a contradiction. Also, regarding other configurations, the embodiments that are disclosed in this Description are merely examples in all aspects. Therefore, various modifications may be made as appropriate without departing from the spirit of the present disclosure.

Outline of the Embodiments

The following briefly describes the outline of the above-described article transport facility.

In one aspect, an article transport facility that is provided in view of the description above is an article transport facility comprising:

a plurality of article transport vehicles that travel along a travel path in only one direction to transport an article; and a transport control apparatus that controls each of the article transport vehicles, wherein the travel path includes a control target path that is located within a control area that is a predetermined area, and an ordinary path that is located outside the control area, the transport control apparatus controls the entrance of the article transport vehicles into the control area such that an intra-area number that is the number of article transport vehicles that are present on the control target path in one control area is no greater than a predetermined control number, the article transport facility further comprises:

a plurality of access points that transmit and receive a wireless signal to and from each of the article transport vehicles;

wireless tags that are respectively mounted on the article transport vehicles and transmit, as the wireless signal, tag information that includes at least information that identifies the article transport vehicles; and a position detection apparatus that acquires the tag information of each article transport vehicle via the access points and detects respective positions of the article transport vehicles based on the same tag information that has been received by the access points, the position detection apparatus detects the respective positions of the article transport vehicles with an accuracy with which a plurality of positions in the control area are distinguishable, and the transport control apparatus acquires positional information that indicates the position of each article transport vehicle from the position detection apparatus, and permits a number of article transport vehicles, the number being greater than the control number, to enter the control area if a predetermined permission condition is satisfied, based on the positional information.

Control target paths in the control area can be of various types, such as a single path, a path that includes a branching point at which the path branches off into a plurality of paths, a path that includes a convergence point at which a plurality of paths converge, a path that includes a branching point and a convergence point, and a path that includes an intersection point at which a plurality of paths intersect with each other. Depending on the structures of the control target paths, there are cases in which, in a situation where a number of article transport vehicles that is equal to the control number are present in the control area, another article transport vehicle can be permitted to enter the control area. In other words, there are cases in which it is possible to ease the condition for controlling the entrance of article transport vehicles into the control area, the condition being for controlling the intra-area number so as to be no greater than the control number. However, it is difficult to set the same eased condition to various control areas. On the other hand, if control area types, such as the shapes of the control areas, is increased in order to use the same eased condition, the control of the control area may become complex and troublesome.

According to the present configuration, the position detection apparatus detects the respective positions of the article transport vehicles with an accuracy with which a plurality of positions in the control area are distinguishable. Therefore, it is possible to control the entrance of article transport vehicles into the control area, not only based on the number of article transport vehicles that are present in the control area (the intra-area number), which simply shows, for example, whether or not an article transport vehicle is present in the control area, but also the positions of article transport vehicles on the control target path. In this regard, the setting of the control area, such as the shape of the control area, remains unchanged, and the control of the control area does not become complex or troublesome. According to this configuration, a number of article transport vehicles that is greater than the control number are permitted to enter the control area if the permission condition is satisfied. Therefore, it is possible to improve the transport efficiency of the facility as a whole. Naturally, if the permission condition is not satisfied, the entrance of article transport vehicles into the control area is restricted based on the intra-area number and the control number. Thus, article transport vehicles in the control area are appropriately prevented from colliding with each other. As described above, according to this configuration, it is possible to prevent article transport vehicles from colliding with each other in the control area, and to ease the restriction on the number of article transport vehicles that can enter the control area.

Here, it is preferable that the article transport facility further comprises: a travel section detection apparatus that detects the positions of the article transport vehicles on the travel path in units of travel sections into which the travel path is divided, wherein the control area includes at least one travel section, the transport control apparatus controls the travel of the article transport vehicles on the travel path and the entrance of the article transport vehicles into the control area based on a result of detection by the travel section detection apparatus, and the position detection apparatus detects the respective positions of the article transport vehicles with a higher accuracy compared to the travel section detection apparatus.

In some cases, the article transport facility is provided with the above-described travel section detection apparatus. In such cases, when an article transport vehicle travels along an ordinary path, it is often the case that the transport control apparatus controls the travel of the article transport vehicle based on the result of detection by the travel section detection apparatus. If the control area includes one travel section, the travel section detection apparatus can detect whether or not an article transport vehicle is present in the control area, but the travel section detection apparatus cannot detect a position in the control area. Also, in cases where the control area includes a plurality of travel sections, the travel section detection apparatus cannot detect the position of the article transport vehicle in the control area with a resolution that is higher than the resolution of the travel sections.

The position detection apparatus can detect the position of an article transport vehicle in the control area with an accuracy that is higher than the accuracy of the travel section detection apparatus, i.e. a resolution that is finer than the resolution of the travel sections. Therefore, the transport control apparatus can control the entrance of article transport vehicles into the control area, based not only on the number of article transport vehicles that are present in the control area (the intra-area number), but also with consideration of the positions of article transport vehicles on the control target path, based on the result of detection by the position detection apparatus.

Here, it is preferable that, when an article transport vehicle out of the article transport vehicles is present at least on the control target path, the transport control apparatus acquires the positional information of the article transport vehicles at a second frequency that is higher than a first frequency at which the transport control apparatus acquires the positional information from the position detection apparatus when the article transport vehicles are present on the ordinary path.

When controlling the entrance of article transport vehicles into the control area, it is preferable that the transport control apparatus can acquire positional information with an accuracy (a resolution) with which a plurality of positions in the control area are distinguishable. Specifically, when an article transport vehicle is travelling on the control target path, positional information with a resolution that is higher than the resolution when the article transport vehicle is travelling on an ordinary path is required. If the intervals at which positional information is acquired are short, the distance that is traveled by an article transport vehicle during the interval is also short, and thus the resolution of positional information increases. When an article transport vehicle is present on the control target path, the transport control apparatus acquires the positional information of the article transport vehicle at the second frequency that is a higher frequency, and therefore, the positional information of the resolution of the article transport vehicle in the control area increases.

Furthermore, it is preferable that a control preparation point is set at a point that is upstream of the control area in the advancing direction of the article transport vehicles, and the transport control apparatus acquires the positional information at the second frequency upon the article transport vehicle arriving at the control preparation point.

The transport control apparatus acquires the positional information at the second frequency upon the article transport vehicle arriving at the control preparation point. Therefore, the transport control apparatus can acquire the positional information of the article transport vehicle at a higher resolution from the point in time where the article transport vehicle has entered the control area.

In one aspect, it is preferable that the article transport facility further comprises: a control area control apparatus that detects the entrance of the article transport vehicles into the control area and the exit of the article transport vehicles from the control area, and determines whether or not to permit the article transport vehicles to enter the control area, wherein the transport control apparatus controls the entrance of the article transport vehicles into the control area based on the result of determination by the control area control apparatus, and if the permission condition is satisfied, the transport control apparatus permits the article transport vehicles to enter the control area regardless of the result of determination by the control area control apparatus.

In order to reduce the load on the transport control apparatus, the control area control apparatus that determines whether or not to permit an article transport vehicle to enter the control area may be provided separately from the transport control apparatus. If the permission condition that is based on the result of detection by the position detection apparatus is satisfied, the transport control apparatus permits article transport vehicles to enter the control area regardless of the result of determination by the control area control apparatus. Therefore, it is possible to improve the transport efficiency of the article transport facility as a whole.

Here, it is preferable that the access points are capable of transmitting and receiving the wireless signal via a first communication channel and a second communication channel that is different from the first communication channel, the transport control apparatus controls the article transport vehicles by performing wireless communication with each of the article transport vehicles using the first communication channel, and the wireless tags transmit the tag information using the second communication channel.

If the transport control apparatus and the article transport vehicles can wirelessly communicate with each other, there is no need to provide a communication cable or the like between them. Therefore, it is possible to simplify the structures of the article transport vehicles and the article transport facility. On the other hand, tag information is also transmitted as a wireless signal from the wireless tags, and therefore, there is the risk of communication quality (the communication speed, the reliability of data, etc.) decreasing due to radio wave interference or the like. However, the access points have communication channels that are different from each other, and wireless communication between the transport control apparatus and the article transport vehicles, and transmission of tag information from the wireless tags, are performed using different communication channels. Therefore, communication quality is prevented from decreasing.

When the access points are capable of transmitting and receiving the wireless signal via a first communication channel and a second communication channel that is different from the first communication channel, in one aspect, it is preferable that the article transport facility further comprises: a network switch that switches the communication channels of the access points to the first communication channel and the second communication channel.

If the access points are not devices that can perform communication using a plurality of communication channels, and the access points in the article transport facility are to be replaced with devices that can perform such communication, there is the possibility of incurring considerable costs, and stopping the article transport facility in order to perform replacement work, for example. However, if a network switch is installed in the article transport facility, it is possible to realize multiple communication channels effectively using the existing access points.

In one aspect, it is preferable that, when preceding vehicles out of the article transport vehicles are present in a predetermined downstream range within the control area, the transport control apparatus subtracts the number of preceding vehicles from the intra-area number and controls the entrance of succeeding vehicles, out of the article transport vehicles, into the control area.

If a preceding vehicle is present in a predetermined downstream range within the control area, it is highly likely that the preceding vehicle will soon exit the control area and the intra-area number will decrease by one. Also, since the preceding vehicle will soon exit the control area, there is no risk of the preceding vehicle colliding with a succeeding vehicle. According to the above-described aspect, for example, it is possible to subtract the number of preceding vehicles from the intra-area number in advance to determine whether or not to permit a succeeding vehicle so that the succeeding vehicle can be permitted to enter the control area without waiting outside the control area.

Also, in one aspect, the control area includes at least one of: a branching point at which the travel path branches off to a plurality of paths; and a convergence point at which a plurality of paths converge, the travel path within the control area is set as different path branches such that the branching point and the convergence point are interposed therebetween, and if no other article transport vehicle is present as a preceding vehicle on a travel destination branch that is a path branch to which an article transport vehicle out of the article transport vehicles is travelling, or on a path branch that is upstream of the travel destination branch and leads to the travel destination branch, the transport control apparatus permits the article transport vehicle to enter the control area as a succeeding vehicle, regardless of the intra-area number.

When no other article transport vehicle (referred to as a "preceding vehicle") is present on the path branch (the travel destination branch) to which an article transport vehicle that enters the control area (referred to as a "succeeding vehicle") is travelling, there is no risk of the succeeding vehicle colliding with the preceding vehicle. Also, when there is a path branch (referred to as an "upstream branch") that is upstream of the travel destination branch and leads to the travel destination branch, if no preceding vehicle is present on the travel destination branch or the upstream branch, there is no risk of a succeeding vehicle colliding with a preceding vehicle. Even if another article transport vehicle (preceding vehicle) is present on another path branch in the control area, there is no risk of a succeeding vehicle colliding with a preceding vehicle because they travel along different travel paths in the control area. Therefore, according to the above-described aspect, if article transport vehicles travel along different travel paths in the control area and there is no risk of a collision, it is possible to permit a succeeding vehicle to enter the control area even if there is a preceding vehicle in the control area. Consequently, it is possible to reduce the period for which a succeeding vehicle needs to wait outside the control area, and to improve the transport efficiency of the article transport facility.

In one aspect, it is preferable that the wireless tags are provided with a tag power supply that supplies power that is required to transmit tag information.

Power supply is usually disconnected while article transport vehicles are not in use. During this period, communication between the article transport vehicles and the transport control apparatus is also disconnected, and, in some cases, the transport control apparatus cannot acquire the accurate positions of the article transport vehicles. If the wireless tags are provided with a power supply, they can transmit tag information regardless of the state of the power supply for the article transport vehicles. Therefore, the position detection apparatus can acquire the accurate positions of the article transport vehicles, based on the tag information. Consequently, the transport control apparatus can immediately and appropriately provide an instruction to transport an article with article transport vehicles based on the positional information upon power being supplied to the article transport vehicles so that the article transport vehicles can transport the article.

What is claimed is:

1. An article transport facility comprising:
   a plurality of article transport vehicles that travel along a travel path in only one direction to transport an article; and
   a transport control apparatus that controls each of the article transport vehicles,
   wherein the travel path includes a control target path that is located within a control area that is a predetermined area, and an ordinary path that is located outside the control area,
   wherein the transport control apparatus controls the entrance of the article transport vehicles into the control area such that an intra-area number that is the number of article transport vehicles that are present on the control target path in one control area is no greater than a predetermined control number,
   the article transport facility further comprising:
   a plurality of access points that transmit and receive a wireless signal to and from each of the article transport vehicles;
   wireless tags that are respectively mounted on the article transport vehicles and transmit, as the wireless signal, tag information that includes at least information that identifies the article transport vehicles; and
   a position detection apparatus that acquires the tag information of each article transport vehicle via the access points and detects respective positions of the article transport vehicles based on the same tag information that has been received by the access points,
   wherein the position detection apparatus detects the respective positions of the article transport vehicles with an accuracy with which a plurality of positions in the control area are distinguishable, and
   wherein the transport control apparatus acquires positional information that indicates the position of each article transport vehicle from the position detection apparatus, and permits a number of article transport vehicles, the number being greater than the control number, to enter the control area if a predetermined permission condition is satisfied, based on the positional information.

2. The article transport facility according to claim 1, further comprising:
   a travel section detection apparatus that detects the positions of the article transport vehicles on the travel path in units of travel sections into which the travel path is divided,
   wherein the control area includes at least one travel section, wherein the transport control apparatus controls the travel of the article transport vehicles on the travel path and the entrance of the article transport vehicles into the control area based on a result of detection by the travel section detection apparatus, and wherein the position detection apparatus detects the respective positions of the article transport vehicles with a higher accuracy compared to the position detection apparatus.

3. The article transport facility according to claim 1, wherein, when an article transport vehicle out of the article transport vehicles is present at least on the control target path, the transport control apparatus acquires the positional information of the article transport vehicles at a second frequency that is higher than a first frequency at which the transport control apparatus acquires the positional information from the position detection apparatus when the article transport vehicles are present on the ordinary path.

4. The article transport facility according to claim 3, wherein a control preparation point is set at a point that is upstream of the control area in the advancing direction of the article transport vehicles, and the transport control apparatus acquires the positional information at the second frequency upon the article transport vehicle arriving at the control preparation point.

5. The article transport facility according to claim 1, further comprising:

a control area control apparatus that detects the entrance of the article transport vehicles into the control area and the exit of the article transport vehicles from the control area, and determines whether or not to permit the article transport vehicles to enter the control area, wherein the transport control apparatus controls the entrance of the article transport vehicles into the control area based on the result of determination by the control area control apparatus, and if the permission condition is satisfied, the transport control apparatus permits the article transport vehicles to enter the control area regardless of the result of determination by the control area control apparatus.

6. The article transport facility according to claim 1, wherein the access points are capable of transmitting and receiving the wireless signal via a first communication channel and a second communication channel that is different from the first communication channel, wherein the transport control apparatus controls the article transport vehicles by performing wireless communication with each of the article transport vehicles using the first communication channel, and wherein the wireless tags transmit the tag information using the second communication channel.

7. The article transport facility according to claim 6, further comprising:

a network switch that switches the communication channels of the access points to the first communication channel and the second communication channel.

8. The article transport facility according to claim 1, wherein, when preceding vehicles out of the article transport vehicles are present in a predetermined downstream range within the control area, the transport control apparatus subtracts the number of preceding vehicles from the intra-area number and controls the entrance of succeeding vehicles, out of the article transport vehicles, into the control area.

9. The article transport facility according to claim 1, wherein the control area includes at least one of: a branching point at which the travel path branches off to a plurality of paths; and a convergence point at which a plurality of paths converge, wherein the travel path within the control area is set as different path branches such that the branching point and the convergence point are interposed therebetween, and if no other article transport vehicle is present on a travel destination branch that is a path branch to which an article transport vehicle out of the article transport vehicles is travelling, or on a path branch that is upstream of the travel destination branch and leads to the travel destination branch, the transport control apparatus permits the article transport vehicle to enter the control area regardless of the intra-area number.

10. The article transport facility according to claim 1, wherein the wireless tags are provided with a tag power supply that supplies power that is required to transmit the tag information.

* * * * *

UNITED STATES PATENT AND TRADEMARK OFFICE
CERTIFICATE OF CORRECTION

PATENT NO. : 9,758,308 B1
APPLICATION NO. : 15/483137
DATED : September 12, 2017
INVENTOR(S) : Tadashi Nishikawa et al.

Page 1 of 1

It is certified that error appears in the above-identified patent and that said Letters Patent is hereby corrected as shown below:

In the Claims

Column 24, Line 24, Claim 9, delete "of;" and insert -- of: --

Signed and Sealed this
Fifth Day of December, 2017

Joseph Matal
*Performing the Functions and Duties of the*
*Under Secretary of Commerce for Intellectual Property and*
*Director of the United States Patent and Trademark Office*